United States Patent [19]
Ootsuki

[11] Patent Number: 5,693,984
[45] Date of Patent: Dec. 2, 1997

[54] SEMICONDUCTOR DEVICE HAVING A HEAT RADIATOR

[75] Inventor: Tetsuya Ootsuki, Nagano-ken, Japan

[73] Assignee: Seiko Epson Corporation, Tokyo, Japan

[21] Appl. No.: 68,665

[22] Filed: May 27, 1993

[30] Foreign Application Priority Data

| Jun. 3, 1992 | [JP] | Japan | 4-142379 |
| Jun. 3, 1992 | [JP] | Japan | 4-142380 |
| Apr. 28, 1993 | [JP] | Japan | 5-103159 |

[51] Int. Cl.$^6$ .................. H01L 23/10; H01L 23/34; H01L 23/495
[52] U.S. Cl. .................. 257/796; 257/706; 257/675; 257/676; 257/784
[58] Field of Search .................. 257/707, 796, 257/668, 675, 722, 676, 666, 784, 706

[56] References Cited

U.S. PATENT DOCUMENTS

| 3,212,569 | 10/1965 | McAdam | 257/722 |
| 3,965,277 | 6/1976 | Gupitz et al. | 427/43 |
| 4,151,543 | 4/1979 | Hayakawa et al. | 257/668 |
| 4,942,497 | 7/1990 | Mine et al. | 257/722 |
| 5,105,259 | 4/1992 | McShane et al. | 257/796 |
| 5,157,478 | 10/1992 | Ueda et al. | 257/675 |
| 5,200,809 | 4/1993 | Kwon | 257/707 |
| 5,208,188 | 5/1993 | Newman | 257/675 |
| 5,227,662 | 7/1993 | Ohno et al. | 257/675 |
| 5,229,643 | 7/1993 | Ohta et al. | 257/706 |
| 5,252,855 | 10/1993 | Ogawa et al. | 257/675 |

FOREIGN PATENT DOCUMENTS

| 164794 | 12/1985 | European Pat. Off. | 257/675 |
| 436126 | 7/1991 | European Pat. Off. | 257/675 |
| 54-124678 | 9/1979 | Japan . | |
| 56-122134 | 9/1981 | Japan . | |
| 58-012341 | 1/1983 | Japan | 257/675 |
| 62-97358 | 5/1987 | Japan . | |
| 63-240053 | 10/1988 | Japan | 257/796 |
| 3222464 | 10/1991 | Japan | 257/796 |
| 4-011758 | 1/1992 | Japan | 257/707 |
| 4-27145 | 1/1992 | Japan . | |
| 4010558 | 1/1992 | Japan | 257/722 |
| 4-91458 | 3/1992 | Japan . | |
| 4-158556 | 6/1992 | Japan . | |
| 4-174551 | 6/1992 | Japan . | |
| 4-199664 | 7/1992 | Japan . | |
| 4-230056 | 8/1992 | Japan . | |
| 6-66351 | 8/1992 | Japan . | |
| 4316357 | 11/1992 | Japan . | |
| 5-211262 | 8/1993 | Japan | 257/675 |
| 6-53390 | 2/1994 | Japan . | |

Primary Examiner—Mahshid D. Saadat
Assistant Examiner—T. M. Arroyo
Attorney, Agent, or Firm—Oliff & Berridge

[57] ABSTRACT

A highly reliable semiconductor device and a method of manufacturing the same. The semiconductor device is constituted by a semiconductor element which is disposed within a space portion defined by leads of a lead frame or fixed to a die pad of a lead frame and which has bonding pads connected to the leads through wires respectively, and a heat radiation block/plate which is made of a good thermally conductive material and which has an outer periphery having a size sufficiently to overlap the leads so that the heat radiation block/plate is disposed on the leads partly through a tape-like insulator, the semiconductor element being disposed on a center portion of the heat radiation block/plate directly or through the die pad. The semiconductor device is sealed with resin or the like with part of the leads and an end surface of the heat radiation block/plate left exposed or with part of the leads left exposed.

34 Claims, 16 Drawing Sheets

F I G. 5
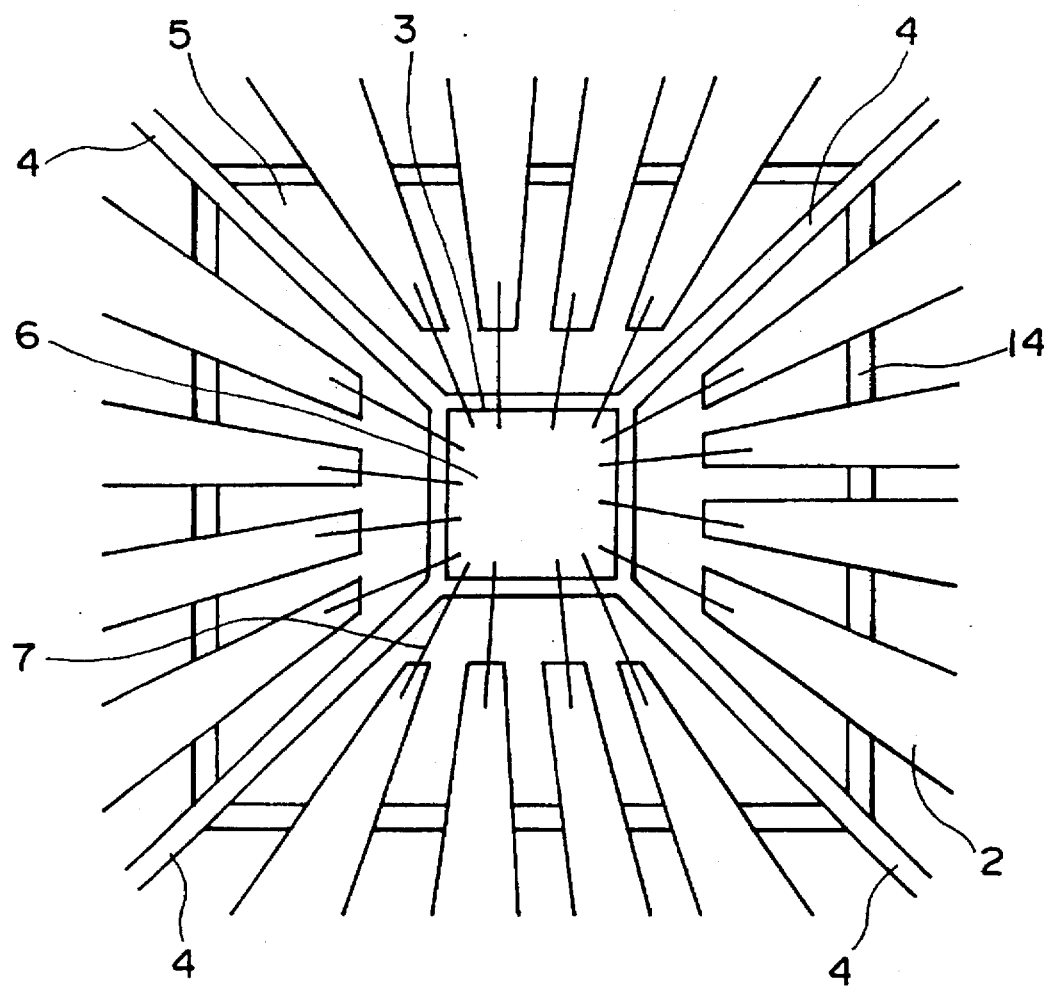

SEMICONDUCTOR DEVICE HAVING A HEAT RADIATOR

BACKGROUND OF THE INVENTION

The present invention relates to a semiconductor device and a method for production of the same, and more particularly relates to semiconductor devices of the exposed heat radiation block type and of the built-in heat radiation plate type, and a method for production of those semiconductor devices.

There are various examples of conventional exposed heat radiation block type semiconductor devices. FIG. 31 is a sectional view of one of the examples. In the drawing, the reference numeral 1 designates a lead frame in which a die pad 3 supported by supporting arms 4 is provided at the center portion of the lead frame. The reference numeral 5 designates a heat radiation block which is stuck on the die pad 3 with an adhesive agent such as epoxy resin, and the reference numeral 6 designates a semiconductor element which is stuck on the die pad 3 with an adhesive agent such as epoxy resin so that the semiconductor element 6 and the heat radiation block 5 are disposed on the opposite sides of the die pad 3. Bonding pads provided in the semiconductor element 6 are connected to leads 2 of the lead frame 1 through wires 7, respectively.

The semiconductor element 6 having a plurality of leads 2 connected through wires 7 in the above-mentioned manner is sealed in the form of a package 8, for example, with epoxy resin, while part of the leads 2 and part (upper surface) of the heat radiation block 5 are left exposed. Then, the leads 2 projecting from the package 8 are bent so as to be used as terminals. Thus, a semiconductor device is produced.

FIG. 32 is a sectional view showing another example of the conventional exposed heat radiation block type semiconductor device. In this example, a lead frame 1 with no die pad is used, and a heat radiation block 5 having a reverse T shape in section is used so that its large-sized lower portion overlaps leads 2 partly. Further, an insulator 9 such as polyimide is applied to the whole surface of the overlapping portion between the leads 2 and the head radiation block 5 so that the heat radiation block 5 is stuck on the leads 2 through the insulator 9. Then, a semiconductor element 6 is stuck on the heat radiation block 5 at the lower surface of the heat radiation block 5 with an adhesive agent. Then, bonding pads of the semiconductor element 6 are connected to the leads 2 through wires 7, respectively. Then, the semiconductor element 6 is sealed in the form of a package 8 with an adhesive agent such as epoxy resin, while part of the leads 2 and part of the heat radiation block 5 are left exposed.

FIG. 33 is a sectional view of an example of a conventional built-in heat radiation plate type semiconductor device. In the drawing, the reference numeral 10 designates a heat radiation plate. An insulating film 11 of epoxy resin or the like is applied to the upper surface of the heat radiation plate 10 except the center portion of the upper surface of the heat radiation plate 10. Circuit terminals 12 which are formed on the insulating film 11 are connected to corresponding leads 2 respectively through welding, soldering or the like. In the center portion of the heat radiation plate 10, a semiconductor element 6 is stuck on the heat radiation plate 10 with an adhesive agent. Bonding pads of the semiconductor element 6 are connected to the corresponding circuit terminals 12 through wires 7, respectively.

In such an exposed heat radiation block type semiconductor device as shown in FIG. 31, the heat radiation block 5 at the time of wire bonding is apt to cause displacement of the position of the die pad because the heat radiation block 5 is stuck only on the die pad 3 through an adhesive. It is therefore necessary to fix not only the leads 2 but the die pad 3. For this reason, not only a special pressing jig is required but quality is unstable because of shortage of strength of the leads 2 after bonding. Further, pressure at the time of resin sealing is apt to cause displacement of the position of the heat radiation block 5 because the heat radiation block 5 is stuck only to the die pad 3 as described above. Accordingly, there are a tendency of deforming the wires 7 and a tendency of involving the surface of the heat radiation block 5 in resin so that the surface is covered with resin. There arises a problem that a sufficient heat radiation effect cannot be attained.

In such an exposed heat radiation block type semiconductor device as shown in FIG. 32, the above-mentioned problems can be more or less solved because the whole surfaces of the leads 2 are stuck on the heat radiation block 5 through the insulator 9. There is however a problem that stable bonding is impossible because of the elasticity of the insulator 9 even if the leads 2 are fixed by using a lead pressing jig at the time of wire bonding. Further, the insulator 9 has hygroscopicity, so that there are a tendency of occurrence of cracking in the package 8 and a tendency of occurrence of problems in breakdown of insulation, etc. Accordingly, the semiconductor device is short in reliability.

On the other hand, in the built-in heat radiation plate type semiconductor device shown in FIG. 33, the junctions of the heat radiation plate 10 and leads 2 are unstable because the heat radiation plate 10 is joined to the leads 2 indirectly through connection of the leads 2 to the respective circuit terminals 12 formed on the insulating film 11. Further, the imposition of bonding loads becomes unstable at the time of wire bonding between the circuit terminals 12 provided on the heat radiation plate 10 and the bonding pads of the semiconductor element 6 because the circuit terminals 12 are formed on the insulating film 11. There arises a problem that improvement of accuracy in bonding cannot be attained.

SUMMARY OF THE INVENTION

The present invention has been attained to solve the above problems in the prior art, and an object thereof is to provide an exposed heat radiation block type semiconductor device in which displacement of a heat radiation block, deformation of bonding wires and involvement of a surface of the heat radiation block in resin can be avoided at the time of packaging of the semiconductor device to thereby attain excellent heat radiation characteristic and high reliability of the semiconductor device, and to provide a method for production of such a semiconductor device.

Another object of the present invention is to provide a built-in heat radiation plate type semiconductor device in which stable connection between a heat radiation plate and leads and stable wire bonding can be performed, and to provide a method for production of such a semiconductor device.

A semiconductor device according to an aspect of the present invention comprises: a semiconductor element disposed within a space portion formed by leads of a lead frame or fixed to a die pad of a lead frame, the semiconductor element having bonding pads connected to the leads through wires respectively; a heat radiation block/plate of a good thermally conductive material, the heat radiation block/plate having an outer periphery of a size sufficiently large to overlap the leads so that the heat radiation block/plate is disposed on the leads through a tape-like insulator at part of the leads, the semiconductor element being disposed on the heat radiation block/plate at a center portion thereon directly or through the die pad; the semiconductor device being sealed with resin or the like while part of the leads and an end surface of the heat radiation block/plate or part of the leads are left as they are exposed.

According to the present invention, as described above, the heat radiation block/plate is formed into a size enough to overlap the leads in the periphery of the heat radiation block/plate and is provided on the leads partly through a tape-like insulator, so that supporting of the heat radiation block/plate is stable. Accordingly, the movement of the block and the like can be suppressed at the time of resin sealing, so that stable resin sealing can be performed. Particularly in the case of a heat radiation block, it is possible to avoid the state in which the surface of the block is involved in resin. Further, because the heat radiation block/plate is formed into a size enough to overlap the leads in the periphery of the heat radiation block/plate, the heat radiation block/plate can be used directly as a presser for pressing the lead portion at the time of wire bonding, so that no complicated jig is required. Further, because the insulator is applied to the peripheral portion of the heat radiation block/plate, wire bonding is not disturbed by the insulator so that the leads can be pressed securely. Accordingly, good-quality bonding can be performed. Further, because the heat radiation block/plate is constituted by an excellent thermally conductive material, heat generated from the semiconductor element can be discharged efficiently so that excellent heat radiation characteristic can be provided.

In the semiconductor device according to another aspect of the present invention, the heat radiation block/plate is supported by supporting arms provided in the lead frame, and the semiconductor element is fixed to the heat radiation block/plate. Alternatively, the heat radiation block/plate is stuck on the leads of the lead frame through the tape-like insulator, and the semiconductor element is fixed to the heat radiation block/plate. According to the present invention, as described above, the heat radiation block/plate is supported by the supporting arms of the lead frame or because the heat radiation block/plate is also fixed to the lead frame, so that positional displacement of the heat radiation block/plate at the time of resin sealing can be avoided and a semiconductor device of stable quality can be produced. Particularly in the case of a heat radiation block, involving of the surface of the block in resin can be avoided so that a semiconductor device of stable quality can be produced.

In the semiconductor device according to a further aspect of the present invention, the semiconductor element is fixed to the die pad of the lead frame, and the heat radiation block/plate is stuck on the rear surface of the die pad and to the leads of the lead frame through the tape-like insulator. According to the present invention, as described above, the semiconductor element is fixed to the die pad of the lead frame while the heat radiation block/plate is stuck both to the rear surface of the die pad and to the leads of the lead frame through the tape-like insulator, so that supporting of the heat radiation block/plate is stabilized more greatly. Accordingly, positional displacement of the heat radiation block/plate at the time of resin sealing can be avoided so that a semiconductor device of stable quality can be produced. Also in this case, involving of the surface of the block in resin can be avoided so that a semiconductor device of stable quality can be produced.

In the semiconductor device according to a further aspect of the present invention, a plurality of projecting arms are provided in the periphery of the heat radiation block/plate, and the projecting arms are partly bent to form supporting portions so that the leads are electrically conductively fixed to the supporting portions respectively. According to the present invention, as described above, the plurality of projecting arms are provided in the periphery of the heat radiation block/plate, and supporting portions are formed by partly bending the projecting arms so that the leads are fixed to the supporting portions so as to be electrically connected thereto, so that heat can be discharged efficiently. Further, because the heat radiation block/plate can be connected to the leads in accordance with the necessity, bonding using the electrical ground commonly can be performed though such bonding is difficult conventionally. Accordingly, the electrical ground can be set through the heat radiation block/plate, so that a semiconductor device having stable electric characteristic can be produced. Further, even in the case where only the supporting arms are used for fixing the heat radiation block/plate to the lead frame and where the connection between the supporting arms and corresponding peripheral leads is performed on the lead frame, the same effect can be attained.

In the semiconductor device according to a further aspect of the present invention, a plurality of through-holes are vertically provided in the heat radiation block/plate. According to the present invention, as described above, the plurality of through-holes are vertically provided in the heat radiation block/plate so that resin can pass through the through-holes at the time of resin sealing, so that not only sealing work can be facilitated but the adhesion of the heat radiation block/plate to resin can be improved.

In the semiconductor device according to a further aspect of the present invention, a plurality of through-holes are vertically provided in the four corners of the heat radiation block/plate. According to the present invention, as described above, the through-holes are vertically provided in the four corners of the heat radiation block/plate, so that pressure applied on the wires at the time of resin sealing is kept uniform and the risk of breaking the wires can be reduced.

In the semiconductor device according to a further aspect of the present invention, oxidizing treatment or plating treatment is applied to the heat radiation block/plate to thereby make the surfaces of the heat radiation block/plate black- or dark-colored. According to the present invention, as described above, the surfaces of the heat radiation block/plate are black- or dark-colored by application of oxidizing treatment or plating treatment, so that not only the adhesion of resin can be improved but bonding machine's recognition at the time of wire bonding can be made easy.

A method for producing a semiconductor device according to a further aspect of the present invention comprises: a step in which a semiconductor element is disposed in a space portion formed by leads of a lead frame or fixed to a die pad of the lead frame, and a heat radiation block/plate made of an excellent thermally conductive material and formed into a size enough to overlap the leads is made in contact with or fixed to the leads partly through a tape-like insulation to thereby make the semiconductor or the die pad be in contact with or fixed to the heat radiation block/plate; a step in which the leads are pressed by a lead presser to thereby make the forward end portions of the leads be in contact with and fixed to the heat radiation block/plate, and the leads are connected to corresponding bonding pads of the semiconductor element through wires, the lead presser being removed thereafter; and a step in which sealing is made with resin with part of the leads and an end surface of the heat radiation block left exposed or with part of the leads left exposed.

In the semiconductor device producing method according to a further aspect of the present invention, the heat radiation block/plate is fixed onto the leads of the lead frame through an insulator and, then, the semiconductor element is fixed to the die pad or the heat radiation block/plate.

In the semiconductor device producing method according to a further aspect of the present invention, the semiconductor device is mounted onto the lead frame, and at the same time, the heat radiation block/plate is fixed onto the lead frame.

In the semiconductor device producing method according to a further aspect of the present invention, the heat radiation block/plate is fixed onto the lead frame at the time of bonding between the bonding pads of the semiconductor elements and the leads through the wires.

According to the present invention, as described above, the heat radiation block/plate is provided on the leads partly through the tape-like insulator so as to make supporting of the heat radiation block/plate stable, so that the block and the like can be suppressed from moving at the time of resin sealing and resin sealing can be performed in a stable state. Particularly in the case of a heat radiation block, there can be avoided the state in which the surface of the block is involved in resin. Further, the heat radiation block/plate is formed into a size enough to overlap the leads in the periphery of the heat radiation block/plate, so that the heat radiation block/plate can be used directly as a presser for the lead portion at the time of wire bonding and no complicated jig is required. Further, the step of fixing the heat radiation block/plate is not limited specifically, so that the production line used in the present state can be used with no change. The shape of the heat radiation block/plate is not limited specifically, so that various types of semiconductor devices can be produced by using the same process in accordance with the purpose of use. Thus, a low-cost semiconductor device can be produced.

A semiconductor device producing method according to a further aspect of the present invention comprises the steps of: preparing a heat radiation block having a tape-like insulator provided on an outer peripheral portion of the upper surface thereof, and setting the heat radiation block into a lower mold for resin injection; mounting a lead frame onto the heat radiation block and the lower mold, the lead frame having leads connected, through wires, to corresponding bonding pads of a semiconductor element which has been disposed in a space portion defined by the leads or which has been fixed to a die pad; and setting an upper mold onto the lower mold with the lead frame sandwiched therebetween, and injecting resin or the like into a hollow portion defined by the upper and lower molds. According to the present invention, as described above, the lead frame is sandwiched between the lower and upper molds for injection of resin, the insulator and the heat radiation block are pressed down on the basis of the elasticity of the lead frame so that the semiconductor element and the wires are kept in correct positions respectively. Accordingly, there can be produced a semiconductor device which is packaged in a state in which the lower surface of the heat radiation block is exposed.

The above and other objects as well as advantageous features of the invention will become more clear from the following description taken in conjunction with the drawings.

BRIEF DESCRIPTION OF THE DRAWINGS

FIG. 3 is completed;

FIG. 5 is a plan view of FIG. 4;

DESCRIPTION OF THE PREFERRED EMBODIMENTS

Embodiment 1

Figure 1:
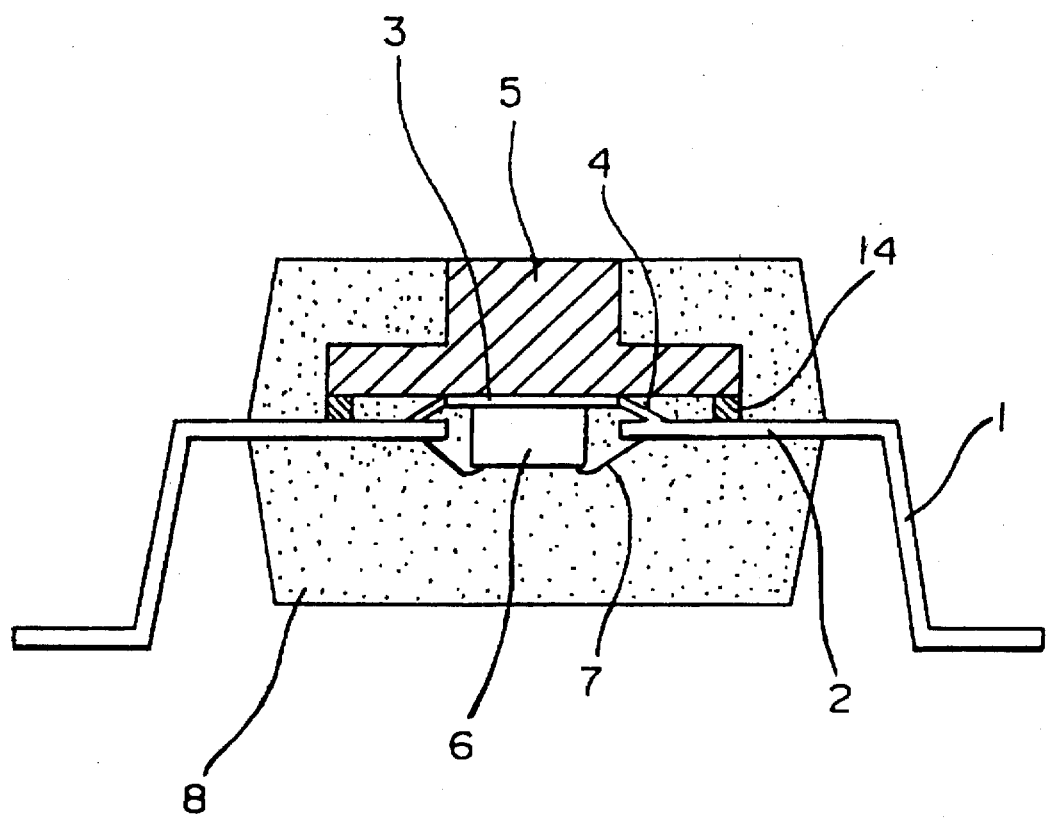
FIG. 1 is a sectional view showing typically a first embodiment of the present invention.
Figure 2:
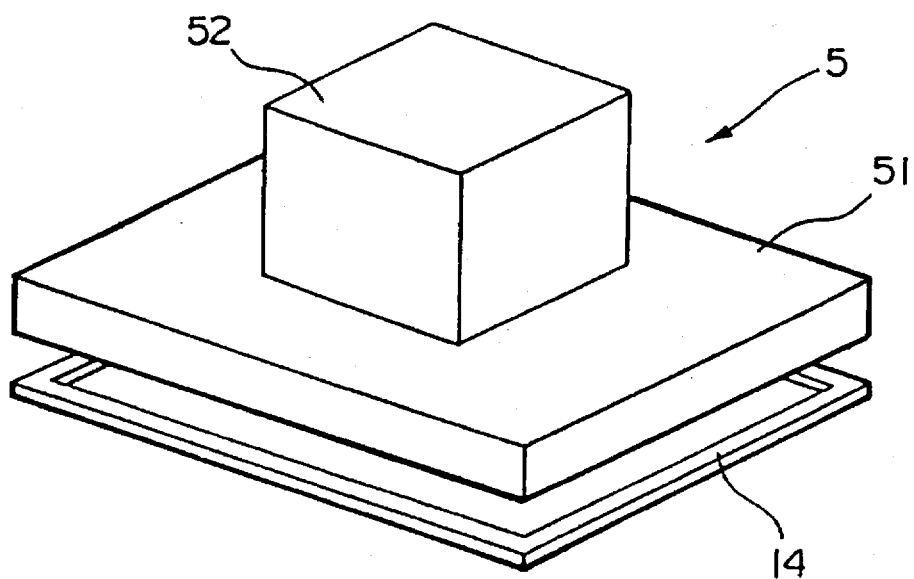
FIG. 2 is a perspective view of the heat radiation block depicted in FIG. 1.

FIG. 1 is a sectional view showing typically a first embodiment of the present invention. In the drawing, the reference numeral 1 designates a lead frame having a plurality of leads 2. A die pad 3 supported by supporting arms 4 is provided in the center portion of the lead frame 1. The reference numeral 5 designates a heat radiation block having a reverse T shape and made from a good thermally conductive material such as copper, copper alloy, aluminum, and aluminum alloy. As shown in FIG. 2, the heat radiation block 5 is constituted by a base 51 larger in size than the die pad 3 of the lead frame 1 so as to partly overlap the leads 2 in its periphery, and a block 52 provided on the base 51 so as to be erected. A tape-like insulator 14 such as a polyimide film is interposed between the peripheral edge of the lower surface of the base 51 of the heat radiation block 5 and part of the leads 2. Accordingly, in this embodiment, an outer edge of the tape-like insulator 14 is substantially aligned with the outer edges of the base 51 of the heat radiation block 5. The center portion of the base 51 is stuck on one surface of the die pad 3 with an adhesive agent. The reference numeral 6 designates a semiconductor element stuck on the other surface of the die pad 3 with an adhesive agent. The leads 2 are connected to corresponding bonding pads of the semiconductor element 6 through wires 7, respectively.

Figure 3:
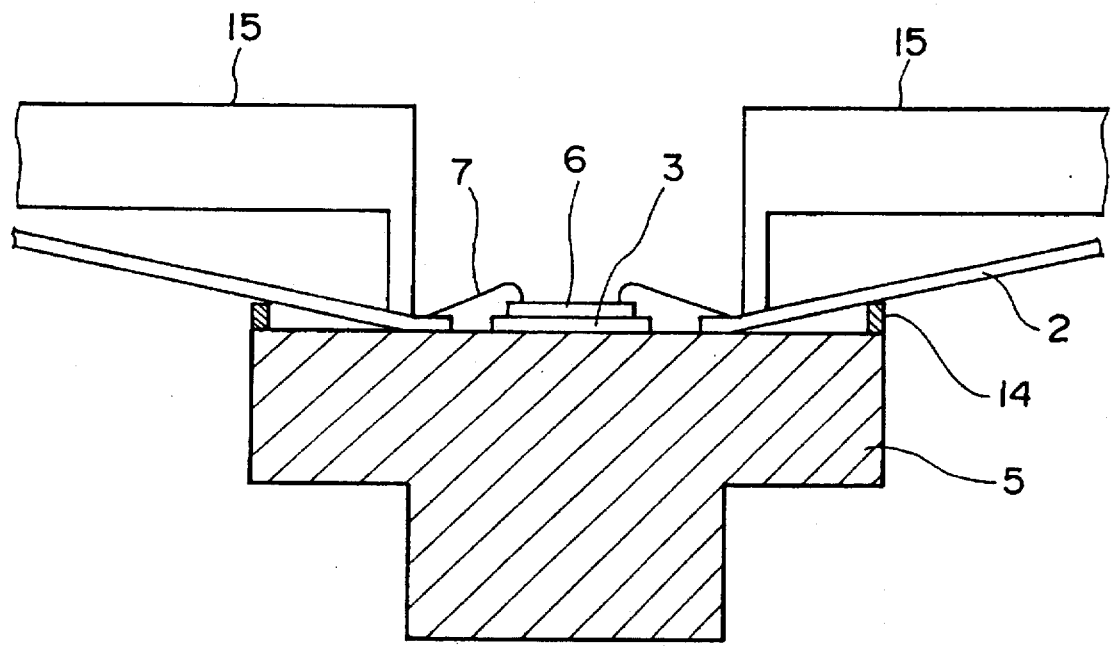
FIG. 3 is a sectional view showing an example of wire bonding in the semiconductor device depicted in FIG. 1.
Figure 4:
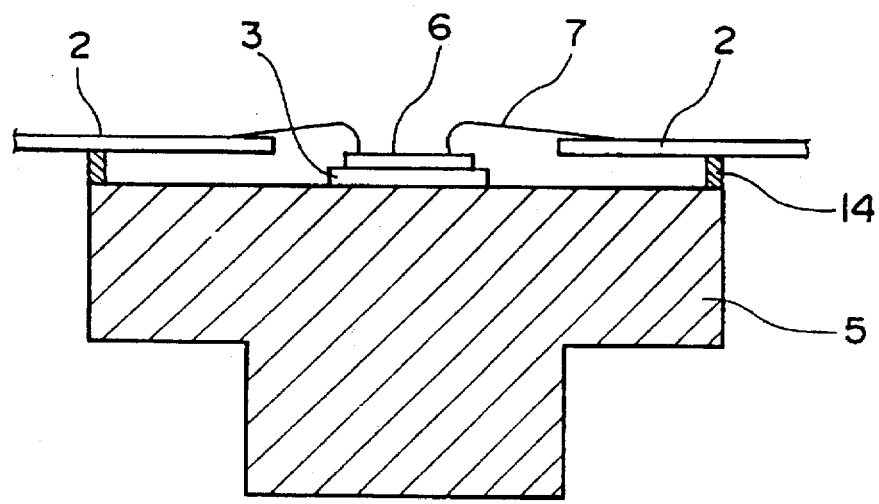
FIG. 4 is a sectional view showing a state of the semiconductor device at the point of time when the wire bonding of p

FIG. 3 shows an example of wire bonding in the above-mentioned semiconductor device. When each of the leads 2 is pressed down by a lead presser 15, the lead 2 pivots on the insulator 14 as a fulcrum so that the forward end portion of the lead 2 is brought into contact with the heat radiation block 5 and held thereagainst. In this state, stable bonding of the wires 7 can be performed. When the lead presser 15 is released after bonding, each of the leads 2 is restored to its original state as shown in FIG. 4 on the basis of its elasticity and kept substantially horizontal so that the lead 2 is insulated from the heat radiation block 5 by the insulator 14. FIG. 5 is a plan view of FIG. 4.

The semiconductor element 6 subjected to bonding as described above is then sealed with epoxy resin or the like in the form of a package 8 while part of the leads 2 and part of the heat radiation block 5 are left open. When the leads 2 exposed from the package 8 are then bent to be provided as terminals, there is produced a semiconductor device in which the upper surface of the heat radiation block 5 is exposed from the package 8.

Although the above description is made upon the case where the heat radiation block 5 is stuck on the die pad 3 and mounted at its peripheral edge onto the leads 2 through the insulator 14, the invention can be applied to the case where not only sticking of the heat radiation block 5 to the die pad 3 is performed but sticking of the respective leads 2 to the insulator 14 with an adhesive agent and sticking of the insulator to the heat radiation block 5 with an adhesive agent are performed.

The heat radiation block 5 may be stuck on the die pad 3 so as to be fixed thereto before the semiconductor element 6 is stuck on the die pad 3. Alternatively, the heat radiation block 5 may be stuck on the die pad 3 simultaneously with the sticking of the semiconductor element 6 to the die pad 3 by using heat used for the sticking of the semiconductor element 6 to the die pad 3.

In the case where each of the leads 2 overlaps the heat radiation block 5 by a small length (for example, 3–4 mm or smaller), fixing of the heat radiation block 5 only to the die pad 3 has an advantage in that the leads 2 are fixed easily by the lead presser at the time of bonding. In the case where the length of the overlap portion is larger (for example, 5–10 mm), fixing of the heat radiation block 5 both to the die pad 3 and to the leads 2 has an advantage.

Embodiment 2

Figure 6:
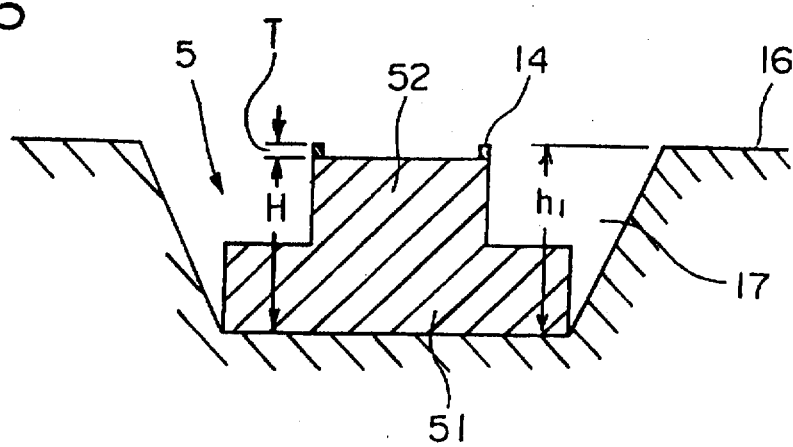
FIG. 6 is an explanatory view showing a state in which the heat radiation block is inserted into a lower mold so as to be positioned according to a second embodiment of the present invention.
Figure 7:
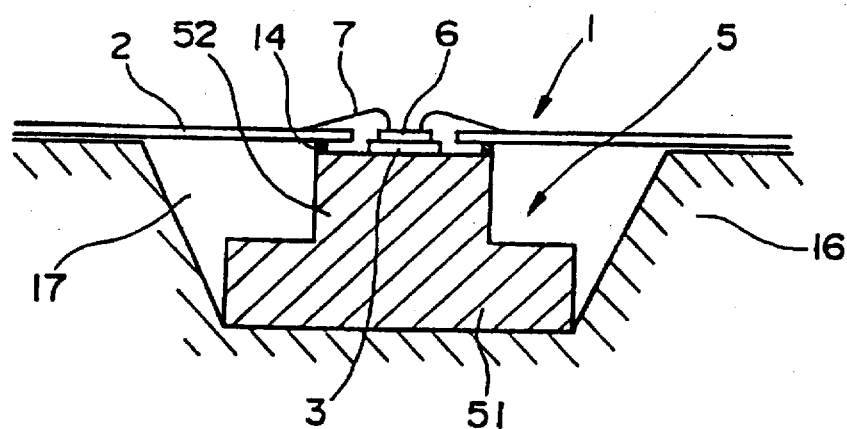
FIG. 7 is an explanatory view showing a state in which a die pad, etc. are mounted on the head radiation block depicted in FIG. 6.
Figure 8:
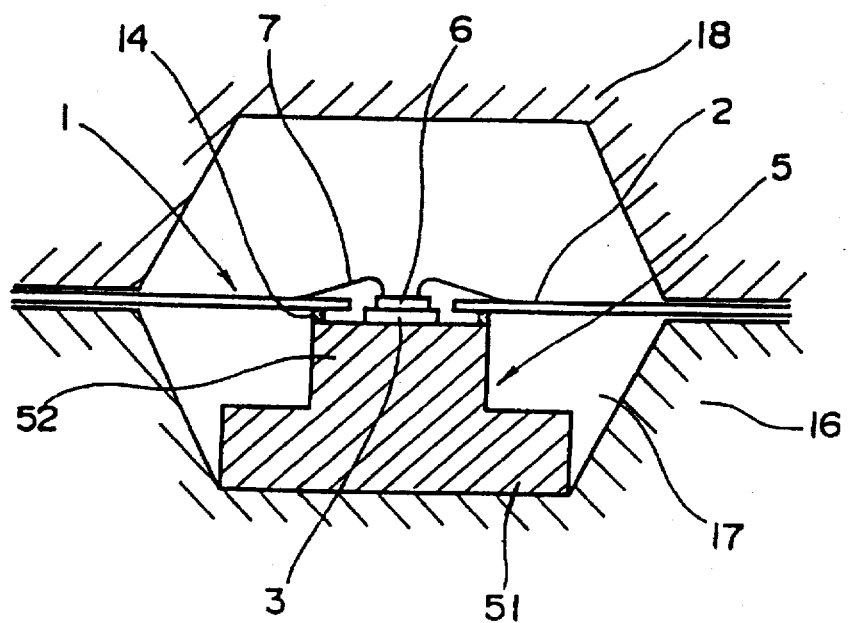
FIG. 8 is an explanatory view showing a state in which an upper mold is put on the heat radiation block being in the state depicted in FIG. 7.

FIGS. 6 to 8 are explanatory views showing a second embodiment of the present invention. In FIG. 6, the reference numeral 16 designates a lower mold for sealing the semiconductor element, etc. with resin. A U-shaped portion 17 is provided as the bottom portion of the lower mold 16 so as to match in shape with the base 51 of the heat radiation block 5, so that the heat radiation block 5 is positioned by being inserted into the U-shaped portion 17 of the lower mold 16. In this embodiment, the tape-like insulator 14 is stuck on the peripheral edge of the upper surface of the block 52 of the heat radiation block 5 with an adhesive agent.

In this state, the semiconductor element 6 is stuck on the die pad 3, and the lead frame 1 having the leads 2 already connected to the bonding pads of the semiconductor element 6 through the wires 7 respectively is mounted so that not only the die pad 3 is positioned on the heat radiation block 5 but the respective leads 2 are positioned on the insulator 14 as shown in FIG. 7. At this time, the die pad 3 is not stuck on the heat radiation block 5, and the respective leads 2 are not stuck on the insulator 14.

Then, as shown in FIG. 8, an upper mold 18 is put on the lower mold 16 so that the leads 2 are sandwiched therebetween. The insulator 14 and the heat radiation block 5 are then pressed down on the basis of the elasticity of the leads 2 so that the semiconductor element 6 and the wires 7 are kept in correct positions accurately. When, in this state, resin is injected into a space formed between the lower mold 16 and the upper mold 18, there is produced a semiconductor device which is packaged while the lower surface of the heat radiation block is exposed.

In this embodiment, the height H of the heat radiation block 5 is preferably selected to be equal to or slightly smaller than the depth $h_1$ of the U-shaped portion 17 of the lower mold 16 (for example, the value of $(h_1-H)$ being in a range of from about 0 to about 0.5 mm) in order to make the heat radiation block 5 stable. Further, the thickness (height)

T of the insulator 14 is preferably selected to be in a range of from about 0.05 to about 0.5 mm. That is, the condition in which $h_1$ and (H+T) are equal to each other is preferable.

Embodiment 3

Figure 9:
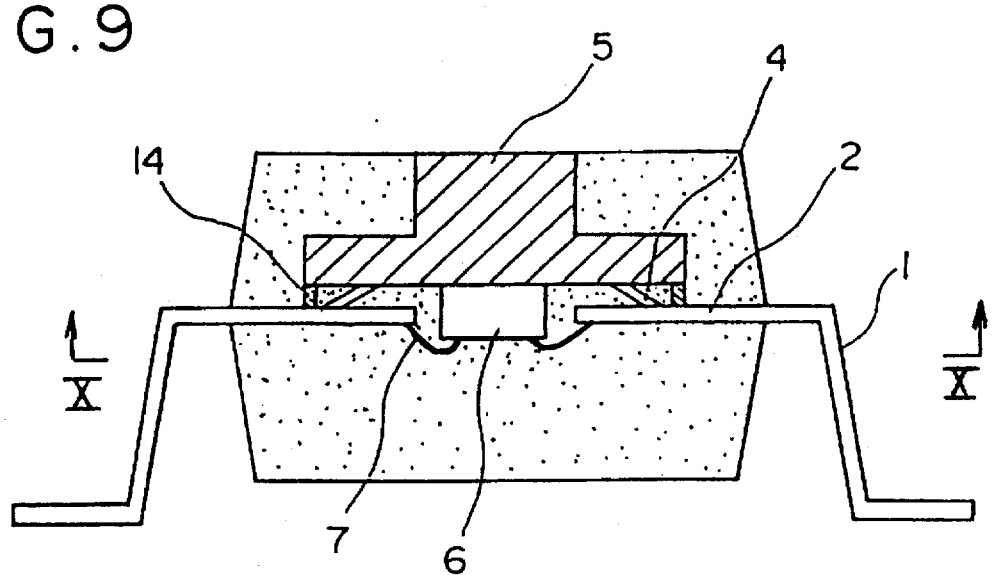
FIG. 9 is a sectional view showing typically a third embodiment of the present invention.
Figure 10:
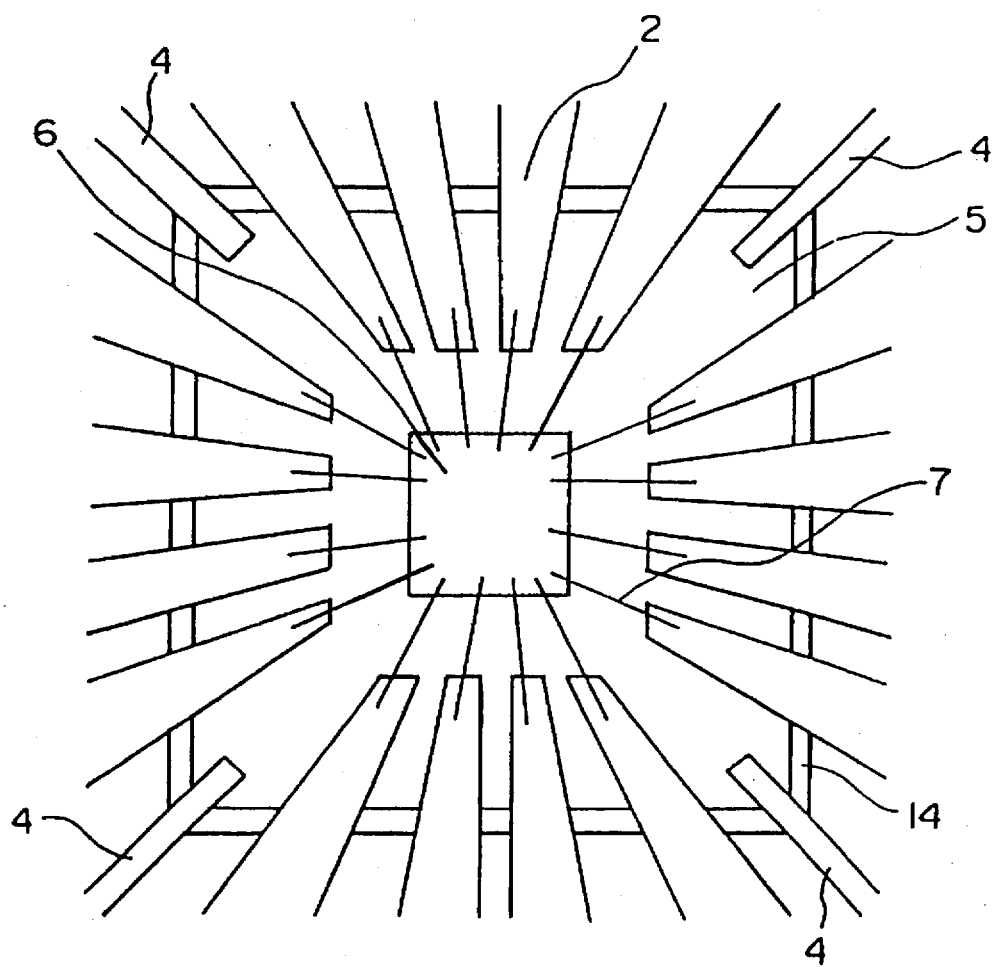
FIG. 10 is a sectional view taken along the line A—A of FIG. 9.

FIG. 9 is a sectional view showing typically a third embodiment of the present invention. FIG. 10 is a sectional view taken along the line X—X of FIG. 9. In this embodiment, a lead frame 1 with no die pad is used so that a heat radiation block 5 is supported by supporting arms 4 of the lead frame 1. Further, a tape-like insulator 14 is stuck on the peripheral edge of the lower surface of the heat radiation block 5 so that the heat radiation block 5 is insulated from leads 2.

The reference numeral 6 designates a semiconductor element which is stuck directly to the lower surface of the heat radiation block 5 with an adhesive agent. The leads 2 are connected to corresponding bonding pads of the semiconductor element 6 through wires 7 respectively in the same manner as in the first embodiment.

The semiconductor element 6 thus connected to the plurality of leads 2 is sealed with epoxy resin or the like in the form of a package 8 while part of the leads 2 and part (upper surface) of the heat radiation block 5 are left open. Then, the leads 2 projecting from the package 8 are bent to form terminals, so that a semiconductor device is produced.

Embodiment 4

Figure 11:
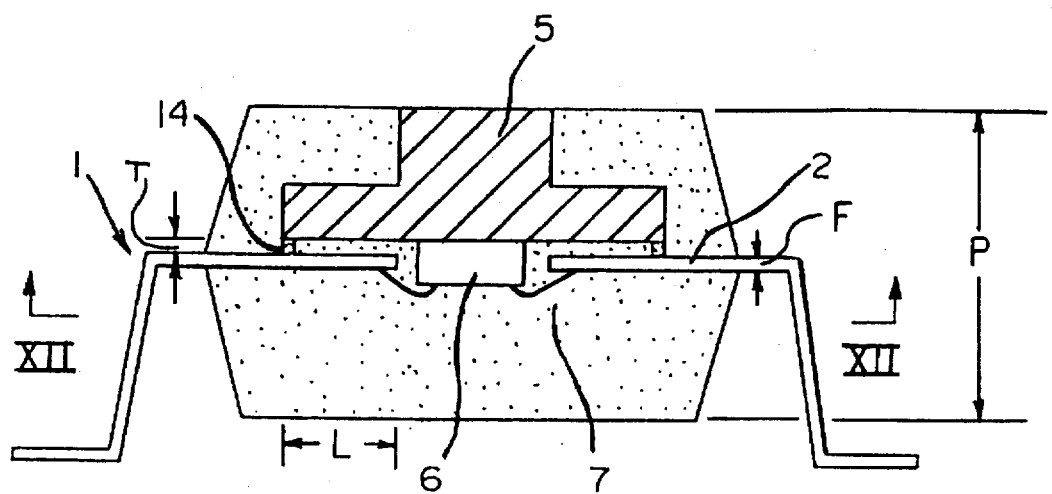
FIG. 11 is a sectional view showing typically a fourth embodiment of the present invention.
Figure 12:
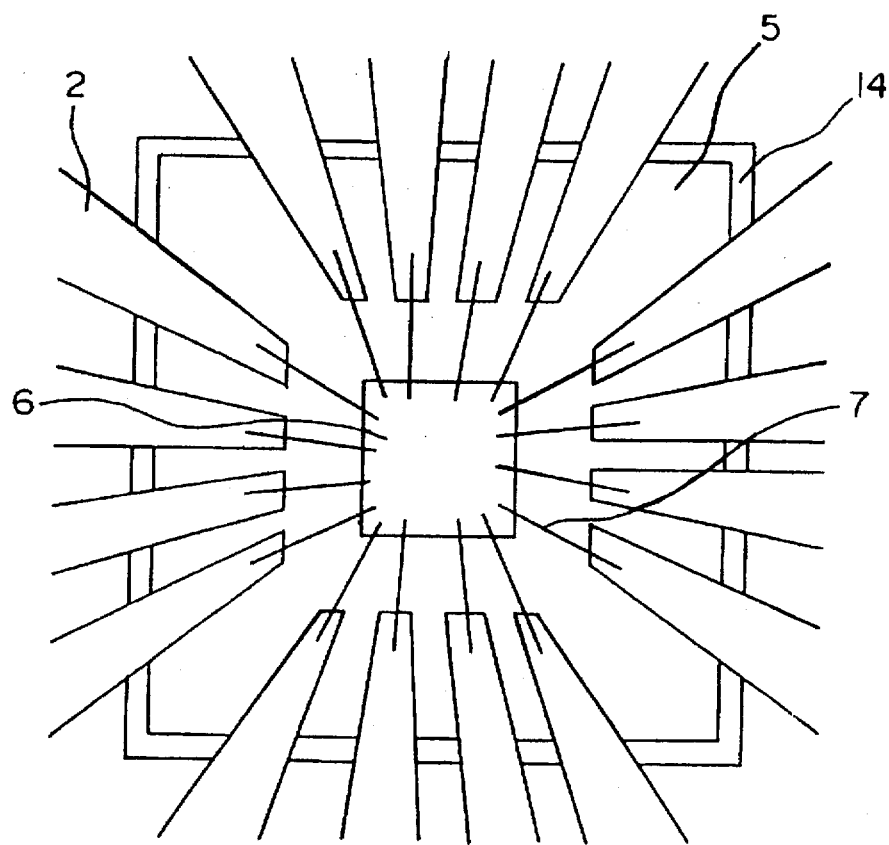
FIG. 12 is a sectional view taken along the line B—B of FIG. 11.

FIG. 11 is a sectional view showing typically a fourth embodiment of the present invention. FIG. 12 is a sectional view taken along the line XII—XII of FIG. 11. In this embodiment, the lead frame 1 has no die pad, so that the heat radiation block 5 is stuck, with an adhesive agent, to the tape-like insulator 14 interposed between the heat radiation block 5 and the leads 2 and is supported by the leads 2.

In the above-mentioned cases of the first embodiment to the fourth embodiment, the thickness (height) H of the heat radiation block used is selected to be 1.6 mm. The thickness P of the package 8 is selected to be 3.35 mm. The thickness F of the lead frame 1 is selected to be in a range of 0.125 to 0.15 mm but mainly selected to be 0.15 mm. The length L of each lead 2 between the insulator 14 and the forward end portion of the lead is selected to be 2 mm. The thickness T of the tape-like insulator 14 such as a polyimide film is generally classified into three types, namely, 0.05 mm type, 0.075 mm type and 0.125 mm type. In the embodiments, the 0.05 mm type or 0.075 mm type insulator 14 are mainly used.

From the above description, the thickness H of the heat radiation block can be represented by the following expression as long as the thickness of the insulator 14 is neglected.

$$H=(P-F)/2$$

Further, the optimum thickness T of the insulator 14 can be represented by the following expression.

$$T \leq 75/2000 \times L$$

Embodiment 5

Figure 13:
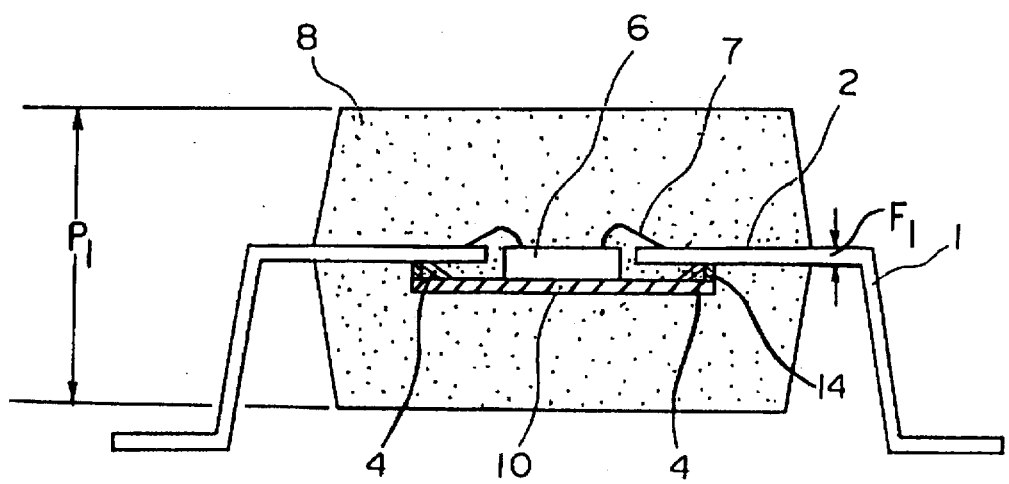
FIG. 13 Is a sectional view showing typically a fifth embodiment of the present invention.

FIG. 13 is a sectional view showing typically a fifth embodiment of the present invention. In the drawing, the reference numeral 10 designates a heat radiation plate made from a highly heat-conductive material such as copper, copper alloy, aluminum, and aluminum alloy. The size of the heat radiation plate 10 is selected so that the periphery of the heat radiation plate 10 overlaps leads 2 partly. The heat radiation plate 10 is supported by supporting arms 4 of a lead frame 1 (see FIGS. 9 and 10). A tape-like insulator 14 such as a polyimide film is interposed between the peripheral edge of the upper surface of the heat radiation plate 10 and the respective leads 2. A semiconductor element 6 is stuck on the heat radiation plate 10 at the center portion of the upper surface of the heat radiation plate 10. The leads 2 are connected to corresponding bonding pads of the semiconductor element 6 through wires 7 respectively.

Figure 14:
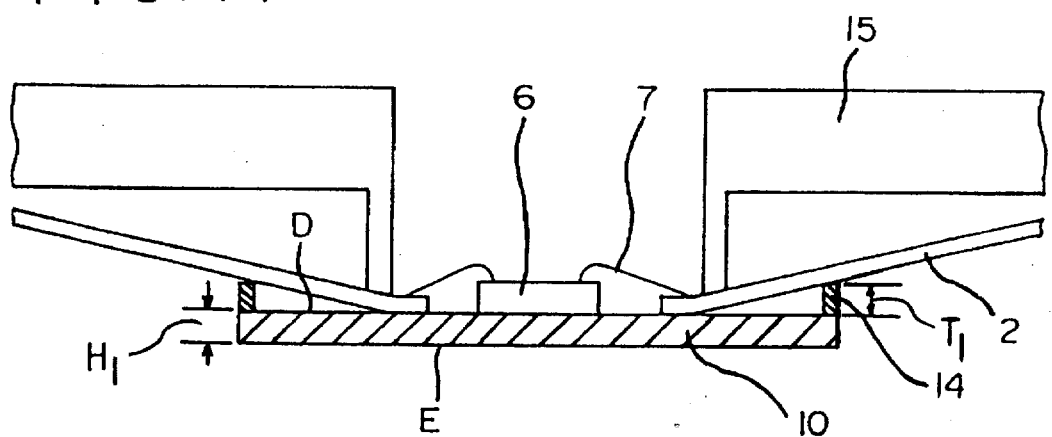
FIG. 14 is a sectional view showing an example of wire bonding in the semiconductor device depicted in FIG. 13.
Figure 15:
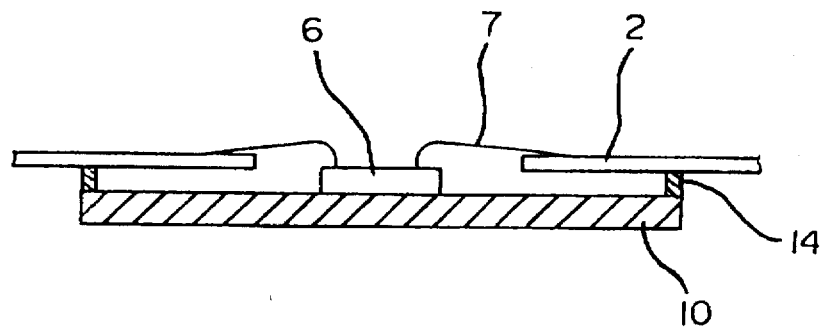
FIG. 15 is a sectional view showing a state of the semiconductor device at the point of time when the wire bonding of FIG. 14 is completed.

FIG. 14 shows an example of wire boding in the above-mentioned semiconductor device. When each of the leads 2 is pressed down by a lead presser 15, the lead 2 pivots on the insulator 14 as a fulcrum so that the forward end portion of the lead 2 is brought into contact with the heat radiation block 5 and fixed thereto. In this state, stable bonding of the wires 7 can be performed. Thus, the wires 7 is bonded to a portion of the leads 2 that is at least $T_1$ distance away from the inner edge of the insulator, where $T_1$ is the thickness of the insulator, as shown in FIG. 14. When the lead presser 15 is released after bonding, each of the leads 2 is restored to its original state as shown in FIG. 15 on the basis of its elasticity and kept substantially horizontal so that the lead 2 is insulated from the heat radiation block 5 by the insulator 14.

The semiconductor element 6 subjected to bonding as described above is then sealed with epoxy resin or the like in the form of a package 8 while the leads 2 are left open partly. When the leads 2 exposed from the package 8 are then bent to be provided as terminals, there is produced a semiconductor device having the built-in heat radiation plate 10.

Although the above-mentioned embodiment shows the case where the heat radiation plate is supported by the supporting arms 4 provided to the lead frame 1, the invention can be applied to the case where a tape-like insulator 14 such as a polyimide film is interposed between the heat radiation plate 10 and the respective leads 2 under the condition in which the heat radiation plate 10 is stuck on a die pad supported by the supporting arms.

Alternatively, a lead frame 1 with no supporting arm and no die pad may be used so that the heat radiation plate 10 is supported by being stuck on an insulator 14 interposed between the heat radiation plate 10 and the respective leads 2.

In the above-mentioned fifth embodiment, the thickness $H_1$ of the heat radiation plate 10 used is selected to be in a range of from 0.1 to 0.5 mm. As the thickness of the heat radiation plate 10 increases, the heat radiation characteristic thereof becomes more excellent. On the contrary, as the thickness decreases, the reliability thereof becomes higher. Accordingly, extreme care must be used in selecting the thickness. The thickness $P_1$ of the package is selected to be 3.35 mm. The thickness $F_1$ of the lead frame 1 is selected to be in a range of from 0.125 to 0.15 mm but mainly selected to be 0.15 mm. Further, the thickness $T_1$ of the tape-like insulator 14 such as a polyimide film is generally classified into three types, namely, 0.05 mm type, 0.075 mm type and 0.125 mm type. In this embodiment, the 0.05 mm type or 0.075 mm type insulator 14 is mainly used.

From the above description, the thickness $H_1$ of the heat radiation plate 10 can be represented by the following expression:

$$0.10 \leq H_1 \leq X$$

in which X is represented by the following equation.

$$X=((P_1-F_1)/2)-T_1$$

Embodiment 6

Figure 16:
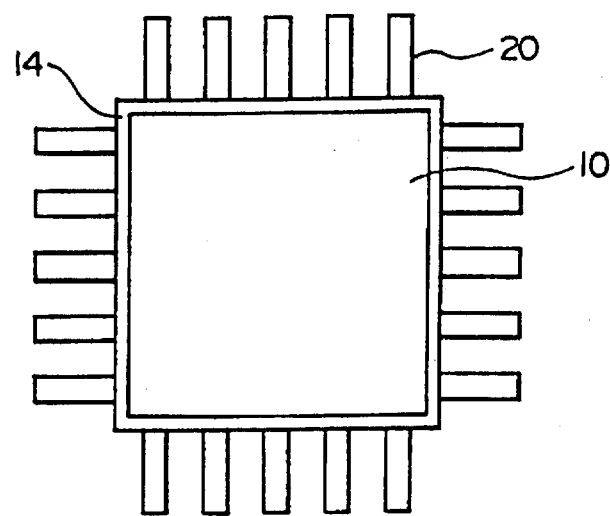
FIG. 16 is a plan view of a heat radiation plate according to a sixth embodiment of the present invention.
Figure 17:
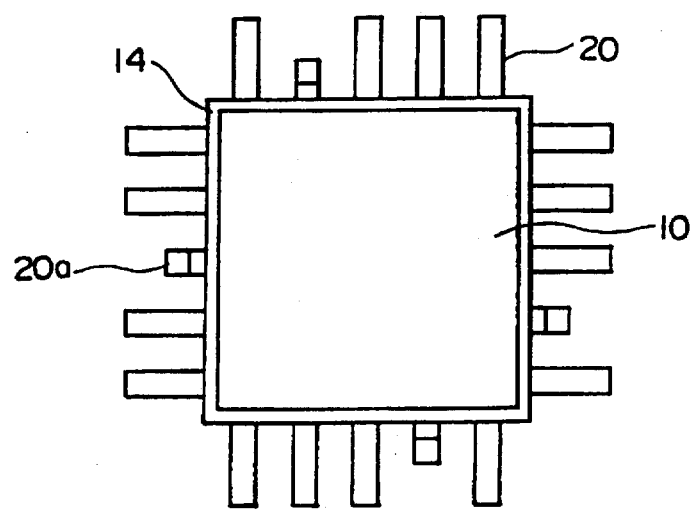
FIG. 17 is a plan view showing a modified example of the projecting arms of FIG. 16.

FIGS. 16 and 17 are plan views of the heat radiation plate according to a sixth embodiment of the present invention. In this embodiment, a heat radiation plate 10 has a plurality of projecting arms 20 which are provided in the periphery of the heat radiation plate 10 so as to be arranged at equal intervals. The number of the projecting arms 20 may be selected to be equal to the number of leads 2 of a lead frame 1 or may be selected to be a suitable value. The reference numeral 14 designates a tape-like insulator such as a polyimide film which is stuck on the peripheral edge of the heat radiation plate 10.

Figure 18:
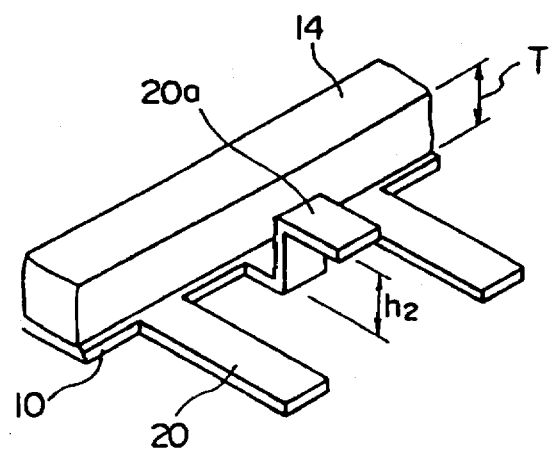
FIG. 18 is a perspective view of the projecting arms of FIG. 17.

As shown in FIGS. 17 and 18, the projecting arms 20 are partly bent toward the insulator 14 side substantially into an S shape to form supporting portions 20a. The height $h_2$ of each of the supporting portions 20a is selected to be substantially equal to the thickness (height) T of the insulator 14.

Figure 19:
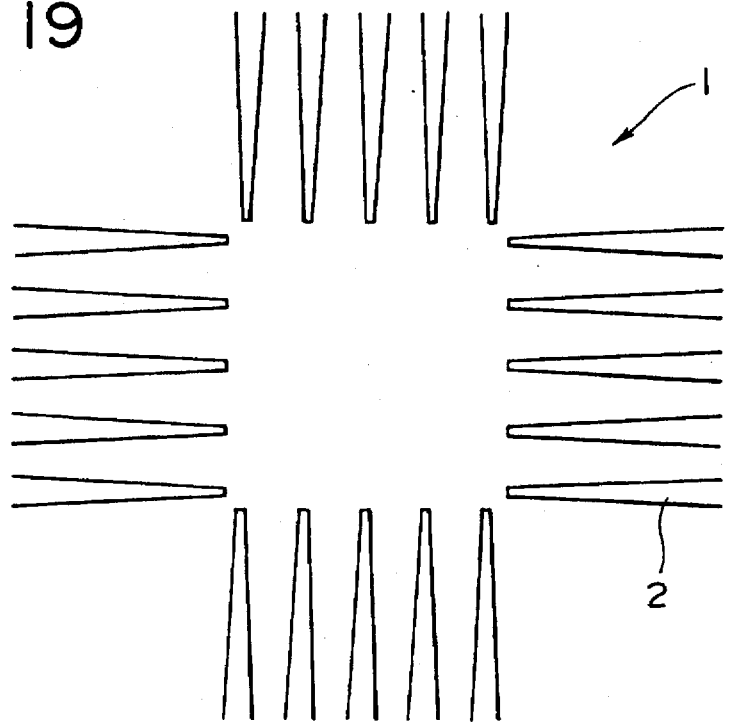
FIG. 19 is a plan view showing lead portions of a lead frame with no die pad.
Figure 20:
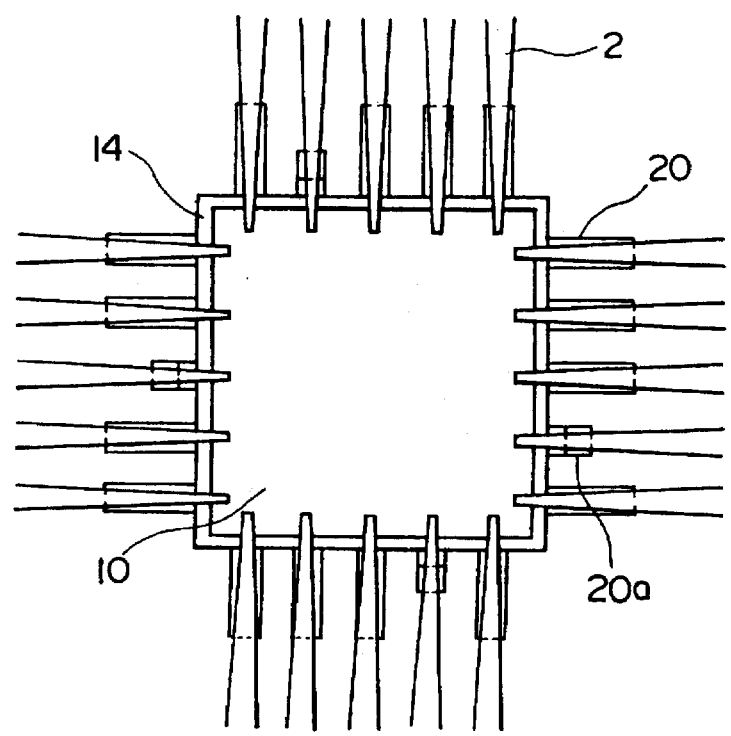
FIG. 20 is a plan view showing a state in which leads are in contact with the supporting arms of the heat radiation plate depicted in FIGS. 17 and 18.
Figure 21:
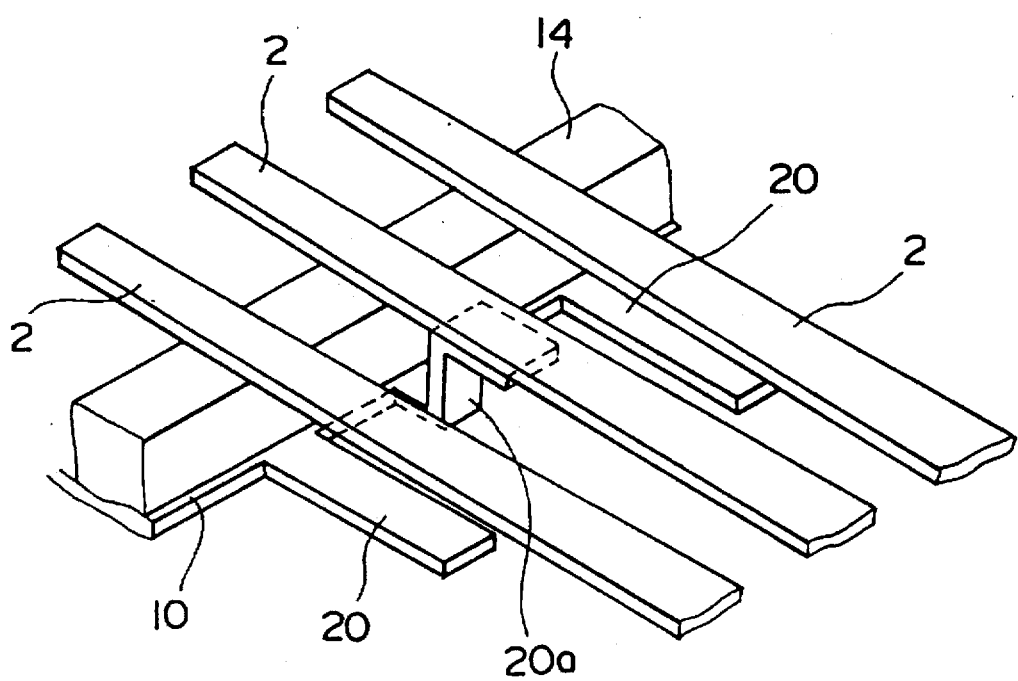
FIG. 21 is a perspective view showing the state of FIG. 20 in which the leads are in contact with the supporting arms.

FIG. 19 shows the lead 2 portion of a lead frame 1 having no die pad. In this embodiment, as shown in FIGS. 20 and 21, the lead frame 1 is put on the heat radiation plate 10 described above with reference to FIGS. 16 to 18 so that the leads 2 are brought into contact with the projecting arms 20 respectively. Then, leads 2 being in contact with the supporting portions 20a are stuck on the supporting portions 20a respectively with an electrically conductive adhesive agent and electrically connected to the heat radiation plate 10 through the supporting portions 20a.

Having described embodiments of the semiconductor device according to the present invention as well as the method for production of the same, embodiments of the heat radiation block or plate constituting important part of the present invention will be described below.

Embodiment 7

Although the above-mentioned embodiments show the case where a heat radiation block 5 having a reverse T shape in section is used, it is to be understood that the shape of the heat radiation block 5 is not limited thereto and that another suitable shape such as a T shape, a rectangular shape, a cylindrical shape, etc. can be selected in accordance with the purpose of use.

Figure 23:
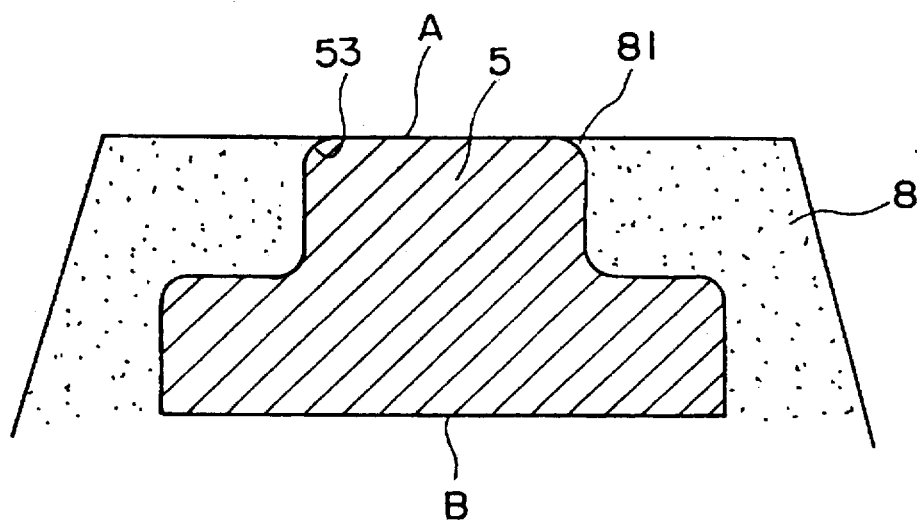
FIG. 23 is a sectional view of a conventional heat radiation block.

Heretofore, a heat radiation block of this type has been generally produced by pressing. As a result, the corner portion 53 of the heat radiation block is rounded (into an acute angle) as shown in FIG. 23. On the other hand, the corner portion 81 of resin is formed into a sharp angle at the time of packaging, so that the corner portion 81 is apt to be broken easily. There arises a risk of invasion of moisture into the package or the like. Further, the heat radiation block produced by pressing is inferior both in the degree of parallelization between the upper and lower surfaces A and B and in the surface roughness. There arise various problems, for example, in that resin enters into the inside at the time of sealing so as to be easily deposited on the surfaces. Furthermore, a cost of 700–800 yen is required per one article.

Figure 22:
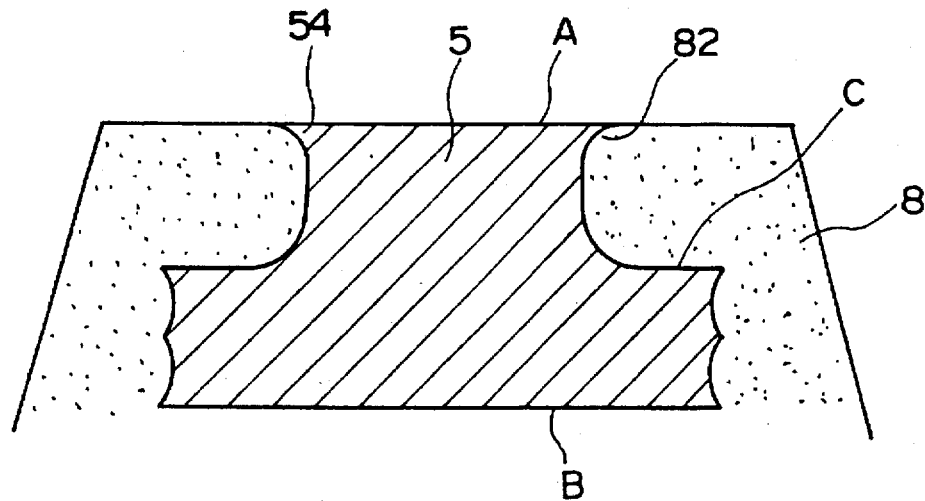
FIG. 22 is a sectional view of the heat radiation block according to a seventh embodiment of the present invention.

To solve the problems, in this embodiment, the heat radiation block 5 is produced by etching. As a result, the corner portion 54 of the heat radiation block is rounded (into an acute angle) in the reverse direction as shown in FIG. 22, so that the corner portion 82 of resin is formed into an acute angle at the time of packaging. There is no risk of breaking the corner portion 82.

Further, because mechanical stress in pressing can be avoided at the time of production, not only the degree of parallelization between the upper and lower surfaces A and B can be determined with high accuracy but the surface roughness can be improved. There arise many advantages, for example, in that undesirable entering of resin can be prevented at the time of resin sealing. The cost on one article can be reduced greatly to about 60 yen.

Embodiment 8

In the above-mentioned exposed heat radiation block type or built-in heat radiation plate type semiconductor device, if the heat radiation block/plate is not perfectly brought in close contact with resin at the time of sealing the semiconductor element, the heat radiation block/plate, etc. with resin, there is a risk of vibration of the semiconductor element and the heat radiation block/plate, cracking of the package or breakdown of insulation.

Figure 24:
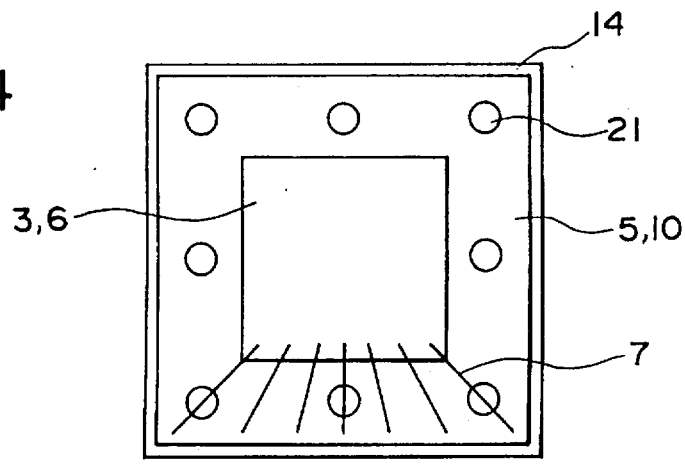
FIG. 24 is a plan view of the heat radiation block or plate according to an eighth embodiment of the present invention.

In this embodiment, therefore, a plurality of through-holes 21 as shown in FIG. 24 are provided in the heat radiation block 5/plate 10, for example, by etching so as to be disposed between the die pad 3/semiconductor element 6 stuck on the heat radiation block/plate and the tape-like insulator 14. Accordingly, resin can pass through the through-holes 21 at the time of resin sealing, so that not only the sealing work can be facilitated but the adhesion of the heat radiation block/plate to resin can be improved.

Figure 25:
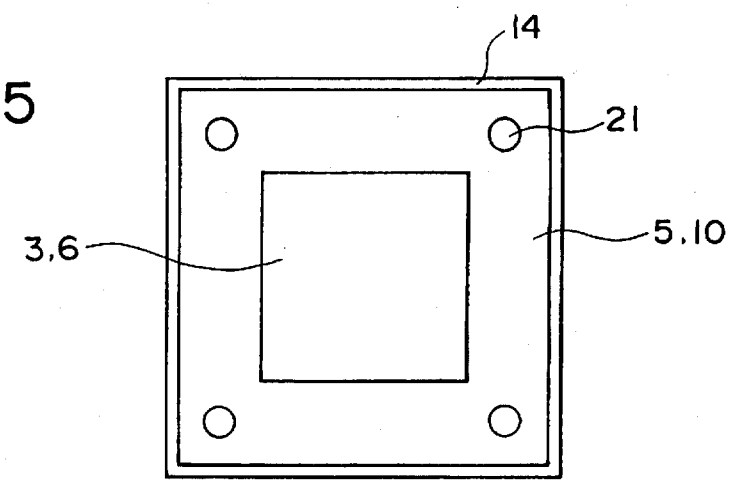
FIG. 25 is a plan view of the heat radiation block or plate according to a ninth embodiment of the present invention.

The number of such through-holes 21 is selected to a desired value. For example, as shown in FIG. 24, through-holes 21 may be provided respectively in the four corners and four midpoints of the heat radiation block 5/plate 10. In this case, the distance between an end portion of each of the through-holes and an end portion of the semiconductor element 6 varies in accordance with the positional difference between the midpoint portion and the corner portion, so that the length of the wire 7 varies in accordance with the positional difference. As a result, pressure applied on the wire 7 at the time of resin sealing varies in accordance with the positional difference, so that there is a tendency of breaking the wire 7. From this point of view, it is preferable that through-holes are provided in the four corners of the heat radiation block 5/plate 10 as shown in FIG. 25.

Embodiment 9

To improve the adhesion of the heat radiation block 5/plate 10 to resin similarly to the Embodiment 8, in this embodiment, the heat radiation block 5/plate 10 is used after black color treatment or dark color treatment is applied to its surfaces by immersing the heat radiation block/plate, for example, in "EBONOL" (tradename, made by MELTEX Inc.) to oxidize its surfaces or by electrically plating the heat radiation block/plate with nickel, chrome, etc. In this configuration of the heat radiation block/plate, the adhesion of resin at the time of packaging can be improved. Furthermore, at the time of wire bonding, not only bonding machine's recognition can be made easy but deterioration of the surfaces can be prevented.

Embodiment 10

Figure 26:
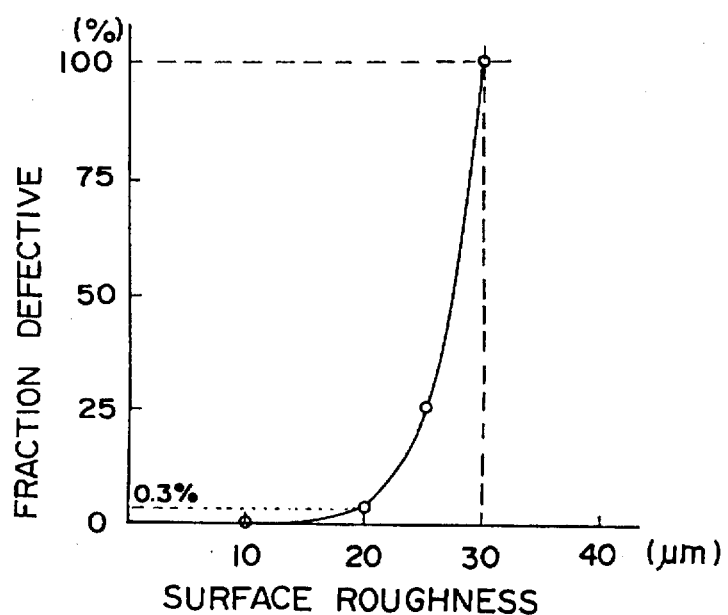
FIG. 26 is a characteristic graph showing the relationship between fraction defective and surface roughness of a surface A of the heat radiation block or plate according to a tenth embodiment of the present invention.

This embodiment is also provided in order to improve the adhesion of the heat radiation block 5/plate 10 to resin similarly to the Embodiment 8. To improve the adhesion of the heat radiation block 5 to resin, for example, it is necessary that the surface roughnesses of the surfaces A, B and C in FIG. 22 are selected to be suitable values respectively. First with respect to the surface A, it is necessary to prevent undesirable entering of resin at the time of resin sealing because the surface A is exposed from the package 8. According to various experiments conducted by the inventors of the present invention, it is proved as shown in FIG. 26 that it is necessary to select the surface roughness of the surface A to be not larger than 0.02 mm (20 μm) in order to keep the fraction defective in an allowable value (0.3%).

Next with respect to the surface B, an ultrasonic wave is applied to the surface B while the leads 2 are pressed by the lead presser 15 at the time of wire bonding as shown in FIG. 3. Accordingly, there is a risk of vibration of the leads 2 because of the ultrasonic wave if the surface B is so much rough.

Figure 27:
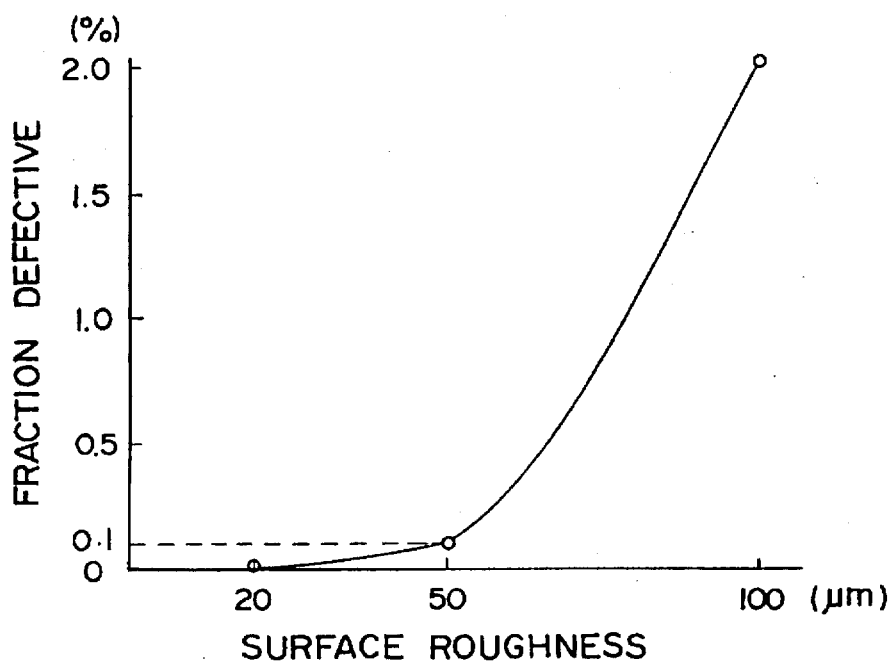
FIG. 27 is a characteristic graph showing the relationship between fraction defective and surface roughness of the other surface B of the heat radiation block or plate in the tenth embodiment of the present invention.

As shown in FIG. 27, it is therefore preferable that the roughness of the surface B is selected to De not larger than 0.05 mm (50 μm) as long as the allowable fraction defective is not larger than 0.1%.

With respect to the surface C, the adhesion of resin is improved more greatly as the surface C becomes more rough. It is however preferable that the roughness of the surface C is selected to be not smaller than 0.02 mm 20 μm and particularly selected to be in a range of from five times to ten times as much as the roughness of the surface A or B, i.e. from about 100 to about 200 μm. Further, it is preferable that the roughness of the surface D of the heat radiation plate 10 (see FIG. 14) is selected to be equal to the roughness of the surface B and that the roughness of the surface E is selected to be equal to the roughness of the surface C.

Embodiment 11

Referring to FIG. 22, the degree of parallelization between the surfaces A and B of the heat radiation block 5 will be discussed below. The terminology "degree of parallelization" used herein means a value obtained by subtracting the minimum value of the distance between the surfaces A and B from the maximum value thereof. In the case where this value is large, there arises a problem that a sufficient heat radiation effect cannot be attained because resin undesirably enters onto the surface A at the time of resin sealing.

Figure 28:
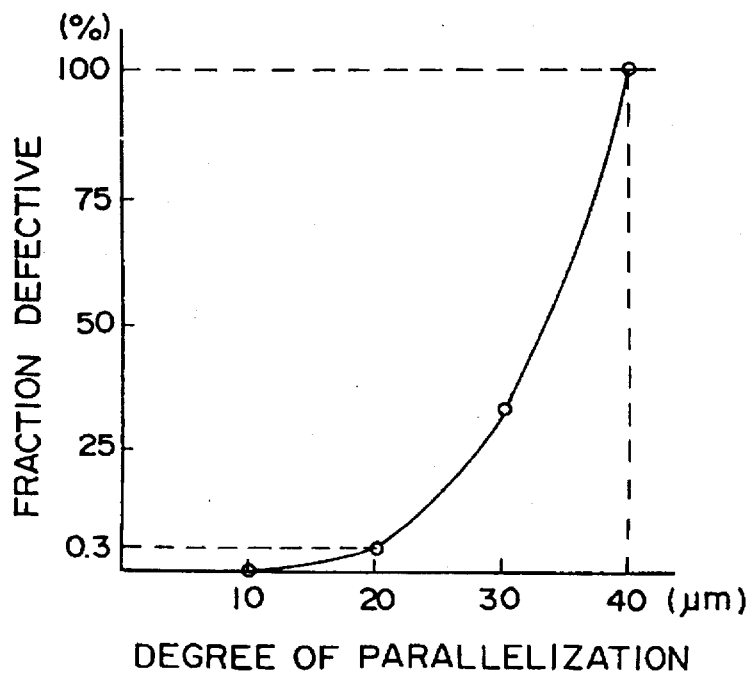
FIG. 28 is a characteristic graph showing the relationship between fraction defective and degree of parallelization of the surfaces A and B of the heat radiation block or plate according to an eleventh embodiment of the present invention.

According to various experiments conducted by the inventors of the present invention upon this point of view, it is proved as shown in FIG. 28 that the degree of parallelization must be selected to be not larger than 0.02 mm (20 μm) in order to keep the fraction defective in an allowable value (0.3%). Accordingly, in this embodiment, the degree of parallelization between the upper and lower surfaces of the heat radiation block 5 is selected to be not larger than 0.02 mm. Like the degree of parallelization between the upper and lower surfaces of the heat radiation block 5, the degree of parallelization between the surfaces D and E of the heat radiation plate 10 as shown in FIG. 14 is also preferably selected to be not larger than 0.02 mm.

Embodiment 12

Figure 29:
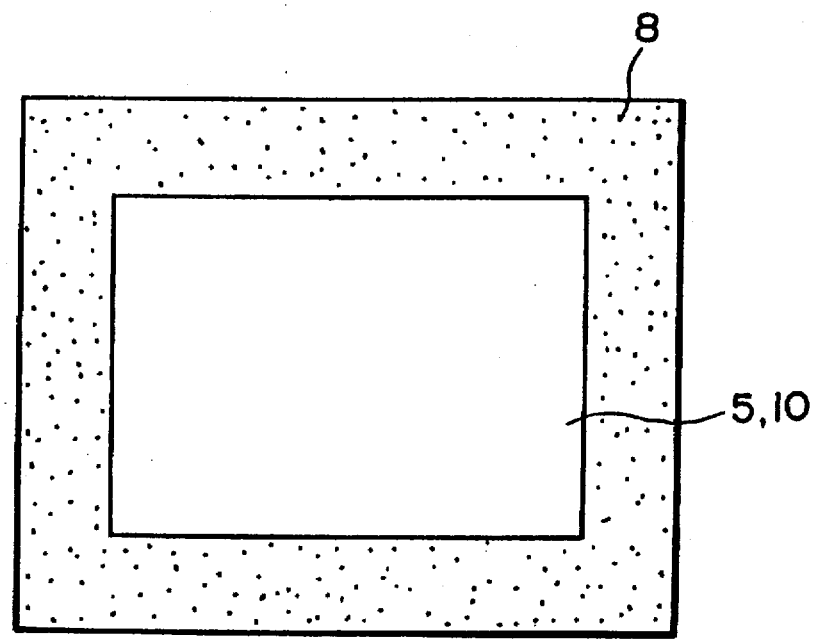
FIG. 29 is an explanatory view (part one) showing the relationship between the external size of the heat radiation block or plate and the external size of the package according to a twelfth embodiment of the present invention.
Figure 30:
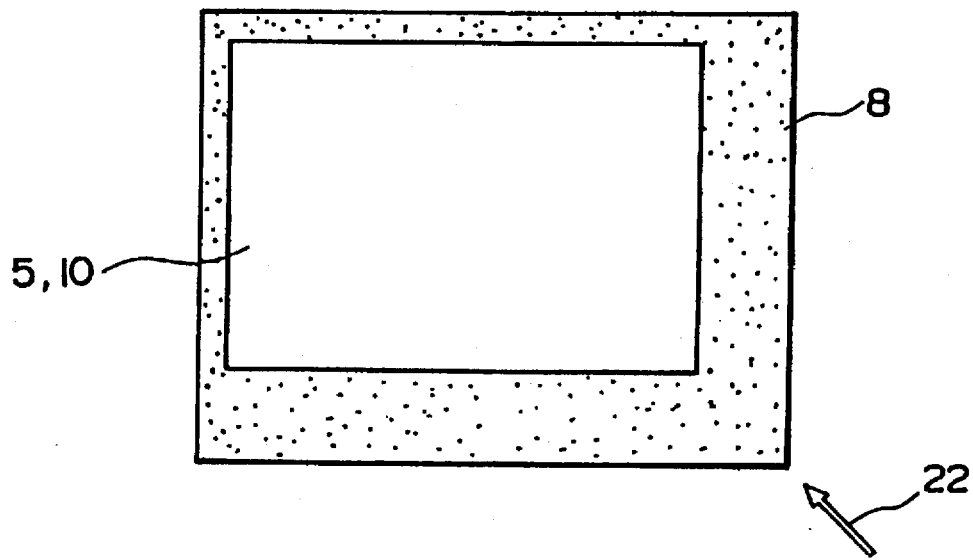
FIG. 30 is an explanatory view (part two) showing the relationship between the external size of the heat radiation block or plate and the external size of the package in the twelfth embodiment of the present invention.
Figure 31:
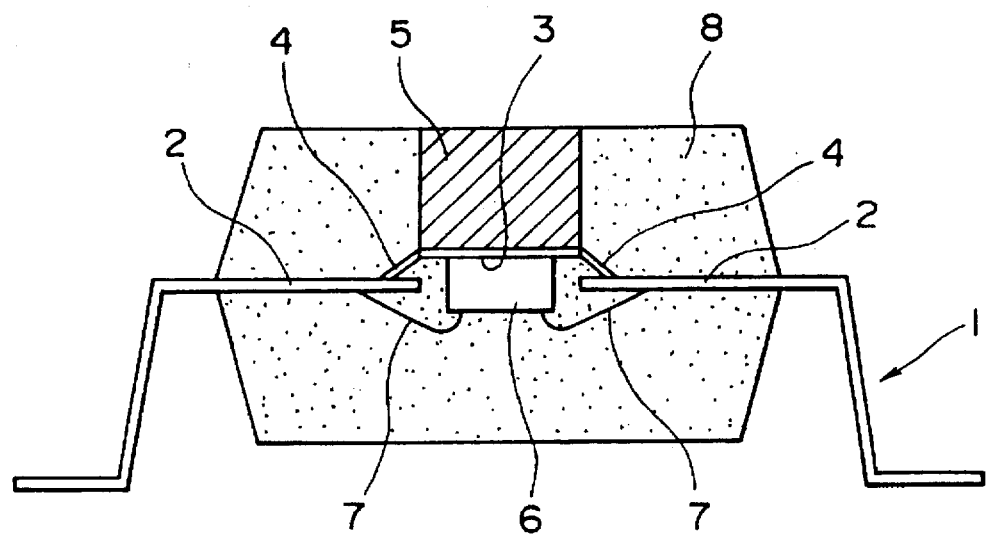
FIG. 31 is a sectional view of an example of a conventional exposed heat radiation block type semiconductor device.
Figure 32:
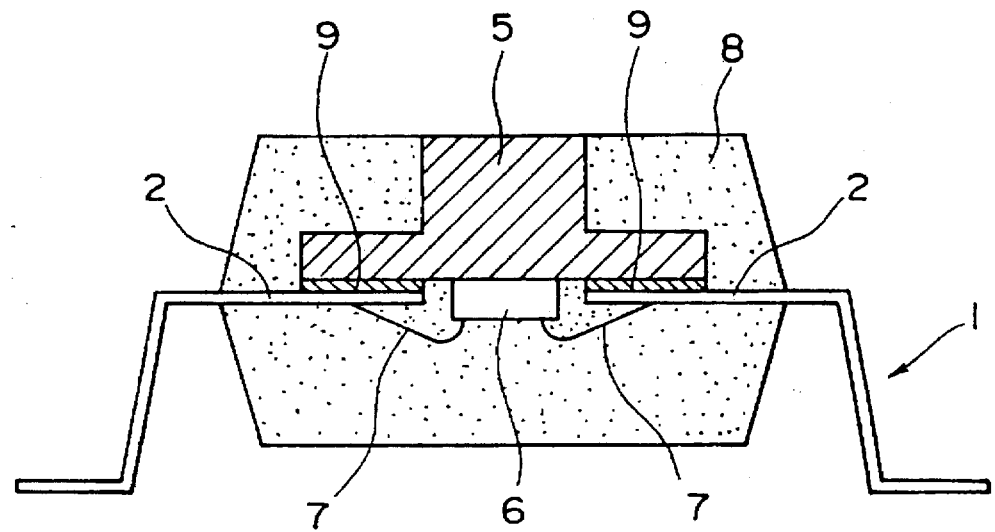
FIG. 32 is a sectional view of another example of a conventional exposed heat radiation block type semiconductor device.
Figure 33:
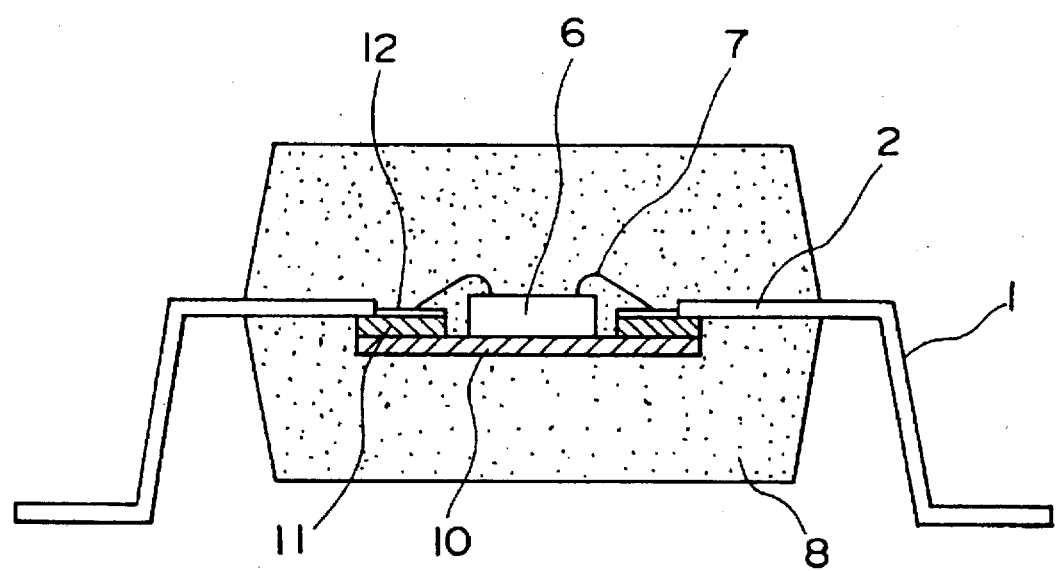
FIG. 33 is a sectional view of an example of a conventional built-in heat radiation plate type semiconductor device.

As described above, each of the heat radiation block 5 (in this case, the base 51) and the heat radiation plate 10 is larger than the space formed by the die pad 3 or leads 2 of the lead frame 1, so that the periphery thereof overlaps the leads 2 partly. The relationship between the heat radiation block/plate and the package 8 is discussed by the inventors of present invention. As a result, it is proved that a gap of 1 mm as shown in FIG. 29 is required for supplying resin throughout the whole securely at the time of injection of resin into the mold. It is therefore necessary that the external size of the heat radiation block 5/plate 10 is 2 mm or more smaller than the external size of the package 8 both lengthwise and widthwise. In an extreme example, the package 8 can be formed even in the case where a gap of 1 mm is provided to two sides nearer to a resin injection port 22 and a gap of not smaller than 0.03 mm is provided to the other two sides as shown in FIG. 30 because resin can pass through the gap of 0.03 mm.

What is claimed is:

1. A semiconductor device comprising:

a heat radiator having a first surface bounded by outer edges;

a semiconductor element mounted on said first surface inwardly of and spaced from said outer edges;

an insulator having a thickness T mounted on said first surface of said heat radiator and having an outer edge substantially aligned with said outer edges of said heat radiator, there being a space along said first surface between an inner edge of said insulator and said semiconductor element;

a plurality of leads contacting said insulator, each of said plurality of leads having a leading edge disposed inwardly from said inner edge of said insulator towards said semiconductor element, each of said plurality of leads having a portion between said inner edge of said insulator and a corresponding leading edge, said portion overlying said space between said insulator and said semiconductor element and being spaced from said first surface by said insulator; and a plurality of wires having first ends, each of said first ends bonded to a respective said portion of one of said plurality of leads at a location which is at least a distance of T from said inner edge of said insulator toward said semiconductor element, and said plurality of wires having second ends bonded to said semiconductor element.

2. A semiconductor device according to claim 1, including a packaging resin sealing said heat radiator, said semiconductor element, said insulator, a part of each of said plurality of leads, and said plurality of wires, said packaging resin forming a package for said semiconductor device.

3. A semiconductor device according to claim 2, wherein said heat radiator includes a plurality of holes extending entirely through said heat radiator, said packaging resin extending into and filling said plurality of holes for securing said heat radiator to said packaging resin.

4. A semiconductor device according to claim 3, wherein said first surface has a quadrilateral shape having corners and each of a portion of said plurality of holes is disposed at one of said corners of said first surface.

5. A semiconductor device according to claim 2, wherein said side surfaces being connected to said second surface with an outwardly flared curve.

6. A semiconductor device according to claim 2, wherein said package formed by the packaging resin has a thickness P, each of said plurality of leads has a thickness about F, and said first and second surfaces of said heat radiator is separated by a distance H, said distance H being about (P–F)/2.

7. A semiconductor device according to claim 2, wherein surfaces of said heat radiator adjacent to a resin injection port are at least about 1 mm from an external surface of said package formed by said packaging resin.

8. A semiconductor device according to claim 2, wherein surfaces of said heat radiator not adjacent to a resin injection port are at least about 0.03 mm from an external surface of said package formed by said packaging resin.

9. A semiconductor device according to claim 2, wherein said first surface of said heat radiator has a roughness of less than about 0.05 mm and said second surface of said projection portion of said heat radiator has a roughness of less than about 0.02 mm.

10. A semiconductor device according to claim 2, wherein a roughness of said side surfaces of said projecting portion of said heat radiator is at least about 0.02 mm.

11. A semiconductor device according to claim 1, wherein said semiconductor element has a surface in direct contact with said first surface of said heat radiator.

12. A semiconductor device according to claim 1, including a die pad disposed between and contacting said semiconductor element and said first surface of said heat radiator.

13. A semiconductor device according to claim 1, wherein $T \leq (75/2000)XL$, where T is the thickness of said insulator and L is a length of said portion of each of said plurality of leads.

14. A semiconductor device according to claim 1, wherein said heat radiator includes a plurality of projecting arms projecting away from said first surface.

15. A semiconductor device according to claim 14, wherein at least one of said plurality of projecting arms support corresponding ones of said plurality of leads, each of the at least one of said projecting arms supporting one corresponding lead.

16. A semiconductor device according to claim 2, wherein $$0.1 \leq H_1 \leq ((P_1 - F_1)/2) - T,$$

where $H_1$, is a distance between said first surface and a second surface of said heat radiator, $P_1$ is a thickness of said package formed by the packaging resin, $F_1$ is an approximate thickness of each of said plurality of leads.

17. A semiconductor device of claim 1, wherein said first surface, a second surface, and side surfaces of said heat radiator are made one of black color and dark color by one of oxidizing and electrical plating.

18. A semiconductor device of claim 17, wherein said first, second, and side surfaces of said heat radiator are treated by oxidation using EBONOL.

19. A semiconductor device of claim 17, wherein said first, second, and side surfaces of said heat radiator are electrically galvanized by one of at least nickel plating and chromium plating.

20. A semiconductor device of claim 1, wherein said first surface and a second surface of said heat radiator is substantially parallel, a difference between a minimum distance and a maximum distance separating said first and second surfaces of said heat radiator being less than about 0.02 mm.

21. A semiconductor device of claim 1, wherein said plurality of leads are adhered to said insulator by adhesives.

22. A semiconductor device of claim 1, wherein said heat radiator has a projecting portion extending away from said first surface, said projecting portion having a second surface and side surfaces.

23. A semiconductor device according to claim 22, wherein said insulator is mounted to said heat radiator by adhesives.

24. A semiconductor device according to claim 22, including a packaging resin sealing said heat radiator except said second surface of said heat radiator, said semiconductor element, said insulator, a part of each of said plurality of leads, and said plurality of wires, said packaging resin forming a package for said semiconductor device.

25. A semiconductor device according to claim 24, wherein said heat radiator includes a plurality of holes extending entirely through said heat radiator, said packaging resin extending into and filling said plurality of holes for securing said heat radiator to said packaging resin.

26. A semiconductor device according to claim 25, wherein said first surface has a quadrilateral shape having corners and each of a portion of said plurality of holes is disposed at one of said corners of said first surface.

27. A semiconductor device according to claim 24, wherein surfaces of said heat radiator adjacent to a resin injection port are at least about 1 mm from an external surface of said package formed by said packaging resin.

28. A semiconductor device according to claim 24, wherein surfaces of said heat radiator not adjacent to a resin injection port are at least about 0.03 mm from an external surface of said package formed by said packaging resin.

29. A semiconductor device according to claim 14, wherein at least one of said plurality of projecting arms contacts corresponding ones of said plurality of leads, each of said at least one of said projecting arms electrically connecting said heat radiator to a corresponding one of said plurality of leads.

30. A semiconductor device of claim 22, wherein said first, second, and side surfaces of said heat radiator are made one of black color and dark color by one of oxidizing and electrical plating.

31. A semiconductor device of claim 30, wherein said first, second, and side surfaces of said heat radiator are treated by oxidation using EBONOL.

32. A semiconductor device of claim 30, wherein said first, second, and side surfaces of said heat radiator are electrically galvanized by one of at least nickel plating and chromium plating.

33. A semiconductor device of claim 22, wherein said first and second surfaces of said heat radiator is substantially parallel, a difference between a minimum distance and a maximum distance separating said first and second surfaces of said heat radiator being less than about 0.02 mm.

34. A semiconductor device comprising:

a heat radiator having a first surface bounded by outer edges;

a semiconductor element mounted on said first surface inwardly of and spaced from said outer edges;

an insulator having a thickness T mounted on said first surface of said heat radiator, there being a space along said first surface between an inner edge of said insulator and said semiconductor element;

a plurality of leads contacting said insulator, each of said plurality of leads having a leading edge disposed inwardly from said inner edge of said insulator towards said semiconductor element, each of said plurality of leads having a portion between said inner edge of said insulator and a corresponding leading edge, said portion overlying said space between said insulator and said semiconductor element and being spaced from said first surface by said insulator; and a plurality of wires having first ends, each of said first ends bonded to a respective said portion of one of said plurality of leads at a location which is at least a distance of T from said inner edge of said insulator toward said semiconductor element, and said plurality of wires having second ends bonded to said semiconductor element.

* * * * *

UNITED STATES PATENT AND TRADEMARK OFFICE
CERTIFICATE OF CORRECTION

PATENT NO. : 5,693,984
DATED : December 2, 1997
INVENTOR(S) : Tetsuya OTSUKI

It is certified that error appears in the above-indentified patent and that said Letters Patent is hereby corrected as shown below:

Title Page: should read item [19]    Otsuki

[75]    Inventor: Tetsuya Otsuki, Nagano-ken, Japan

Signed and Sealed this

Seventh Day of December, 1999

Attest:

Q. TODD DICKINSON

*Attesting Officer*   *Acting Commissioner of Patents and Trademarks*